United States Patent
Feurer et al.

(10) Patent No.: US 8,623,450 B2
(45) Date of Patent: Jan. 7, 2014

(54) METHOD FOR PRODUCING A FLEXIBLE CIRCUIT CONFIGURATION

(75) Inventors: Ernst Feurer, Blaustein (DE); Bruno Holl, Ulm (DE); Alexander Kaiser, Schemmerhofen (DE); Karin Ruess, Stuttgart (DE)

(73) Assignee: Cicor Management AG, Zurich (CH)

( * ) Notice: Subject to any disclaimer, the term of this patent is extended or adjusted under 35 U.S.C. 154(b) by 437 days.

(21) Appl. No.: 12/896,350

(22) Filed: Oct. 1, 2010

(65) Prior Publication Data

US 2011/0274829 A1 Nov. 10, 2011

(30) Foreign Application Priority Data

May 4, 2010 (DE) .................. 10 2010 016 779

(51) Int. Cl.
*B05D 5/12* (2006.01)
(52) U.S. Cl.
USPC ....... 427/97.3; 427/97.4; 427/97.6; 427/98.4; 427/99.2
(58) Field of Classification Search
USPC ............... 427/97.6, 97.3, 97.4, 98.4, 99.2
See application file for complete search history.

(56) References Cited

U.S. PATENT DOCUMENTS

| 7,247,524 B2 * | 7/2007 | Nakagawa | 438/118 |
| 7,641,124 B2 * | 1/2010 | Brown et al. | 235/493 |
| 2006/0216861 A1 | 9/2006 | Nakagawa | |
| 2007/0241201 A1 | 10/2007 | Brown et al. | |
| 2009/0223700 A1 | 9/2009 | Youngner et al. | |

FOREIGN PATENT DOCUMENTS

| EP | 0442674 | * | 8/1991 |
| EP | 0442674 A2 | | 8/1991 |
| EP | 1890326 | * | 2/2008 |
| EP | 1890326 A2 | | 2/2008 |

OTHER PUBLICATIONS

International search report for PCT/EP2011/056783 dated Sep. 7, 2011.

* cited by examiner

*Primary Examiner* — Brian K Talbot
(74) *Attorney, Agent, or Firm* — McCormick, Paulding & Huber LLP

(57) ABSTRACT

For a method for producing a flexible circuit configuration in the form of a layer sequence of at least one insulating layer and at least one conductive layer, typically multiple insulating layers (N1, N2, N3, NF) and multiple structured conductive layers (L1, L2), the layer sequence for the flexible circuit configuration is deposited on a rigid substrate so that the adhesion of the layer sequence with respect to the substrate is less in an inner area, in which at least one, preferably multiple flexible circuit configurations are created, than in an edge area (RB) which surrounds the inner area (ZB). An intermediate layer can advantageously be deposited for this purpose in the edge area, which causes a stronger adhesion of the layer sequence over the edge area than the inner area, which is not provided with an intermediate layer.

29 Claims, 3 Drawing Sheets

METHOD FOR PRODUCING A FLEXIBLE CIRCUIT CONFIGURATION

CROSS REFERENCE AS TO RELATED APPLICATIONS

This patent application claims priority of the German patent application No. DE 102010016779.7, filed on 4 May 2010. The entire content of this priority defining application is incorporated herein by explicit reference for any purpose.

There are two related co-pending US applications which are filed on the same day as the present application. The first entitled METHOD FOR PRODUCING A FLEXIBLE CIRCUIT CONFIGURATION, FLEXIBLE CIRCUIT CONFIGURATION, AND ELECTRICAL CIRCUIT CONFIGURATION HAVING SUCH A FLEXIBLE CIRCUIT CONFIGURATION claims the priority of the German patent application No. DE 102010016780.0, filed on 4 May 2010. The second entitled METHOD FOR PRODUCING A FLEXIBLE CIRCUIT CONFIGURATION claims the priority of the German patent application No. DE 102010016781.9, filed on 4 May 2010.

FIELD OF THE INVENTION

The invention relates to a method for producing a flexible circuit configuration having multiple layers, which form a layer sequence.

BACKGROUND OF THE INVENTION

Flexible circuit configurations are advantageous for use, inter alia, in applications in which the circuit configuration must have permanent flexible properties, in particular in body implants or objects which are at least limitedly flexible in use, such as credit cards.

A structure of a credit card having an integrated electromagnetic configuration is known from US 2007/0241201 A1. The card consists of multiple layers, which are fixedly connected to one another, a middle layer forming a flexible circuit board, on which a flexible circuit configuration having a plurality of coils in a multilayer layer sequence is in turn situated.

Such a flexible circuit configuration having coils, which enclose a core made of magnetic material, can be produced, for example, in that a layer sequence of insulating layers, conducting layers, and at least one layer made of magnetic material is deposited on a rigid silicon substrate, and at least multiple layers are each structured differently after being deposited. The structuring is typically performed by photolithography using different masks.

For a high packing density of passive and/or active circuit elements in the flexible circuit configuration, such as a high number of coils each having multiple turns on only a short overall length of the magnetic chip in the above-mentioned credit card application, in addition to a fine resolution of the structures, a high precision during the continuously new orientation of the masks relative to structures which have already been created is required in particular. This is achievable per se using a rigid substrate, such as a silicon wafer, on which the layer sequence for a plurality of flexible circuit configurations is preferably deposited and which maintains a fixed position during the typical multiple temperature changes. The flexible circuit configuration is removed from the substrate after the creation of the layer sequence, e.g., by dissolving an adhesive layer between substrate and layer sequence or by mechanical peeling off of the substrate surface. Damage to the flexible circuit substrate, which is only fractions of a millimeter thick, can in turn result due to mechanical strains and/or due to the action of etching media, solvents, or the like.

SUMMARY OF THE INVENTION

The present invention is based on the object of specifying an advantageous method for producing a flexible circuit configuration.

The invention is described in the independent claim. The dependent claims contain advantageous embodiments and refinements of the invention.

The division of the surface of the substrate into at least one inner area and an edge area, which encloses this inner area, and the design of the intermediate layer, so that the adhesion of the first layer of the layer sequence deposited over the substrate for the flexible circuit configuration is stronger over the edge area than over the inner area, allows, on the one hand, maintaining the positioning of the various structures of the individual substrates relative to one another and relative to reference points of the rigid substrate precisely over the entire time of the production process, while the layer sequence remains on the substrate. This is significant in particular during the creation of the at least one, typically multiple insulating layers by solidification at elevated temperatures of an insulating material which is applied free-flowing, typically temperatures greater than 250° C. The edge area, which is advantageously peripherally closed around the inner area, having the stronger adhesion of the layer sequence on the substrate additionally prevents the penetration of liquids used during the production process under the layer sequence. Liquids penetrating under the layer sequence may result in detachment from the substrate and in particular in bubbling at elevated processing temperatures. The at least one flexible circuit configuration is created over the at least one inner area, so that the circuit configuration lies inside the inner area in projection perpendicular to the substrate surface.

On the other hand, the low adhesion of the first layers of the layer sequence of the flexible circuit configuration in the inner area over the substrate allows the easy detachment of the flexible circuit configuration from the substrate. In particular if a solvent is used, application parameters may be optimized, in particular the action time and/or temperature may be reduced. The circuit configuration can be lifted off mechanically against a lower adhesion force and thus with reduced danger of damage of the circuit configuration. In a preferred embodiment, it can be provided that the flexible circuit configuration is only mechanically removed from the substrate, without the use of a solvent.

In a first advantageous embodiment, a single inner area can be provided, over which one or preferably multiple flexible circuit configurations, which are particularly close to one another flatly, are created in the layer sequence. In another advantageous embodiment, multiple inner areas may be provided, over each of which at least one of multiple flexible circuit configurations is created, and which are laterally spaced apart from one another in the area of the substrate by one or more separation areas, in which the adhesion of the layer sequence is stronger than in the inner areas. The adhesion of the layer sequence can advantageously be essentially equal in these separation areas to the adhesion in the edge area. The separation areas may be coherent with the edge area. The multiple inner areas may each be completely bounded individually by edge and/or separation areas having higher adhesion.

For the sake of simplicity, a single inner area within an edge area is presumed hereafter without restriction of the generality. The embodiments apply, if not obviously precluded, similarly to embodiments having multiple inner areas and one or more separation areas.

For the creation of the differing adhesion, the intermediate area can partially or completely have different materials or a different layer structure in the edge area than in the inner area. In particular, an adhesion-reducing intermediate layer can only be provided in the inner area and can be dispensed with entirely in the edge area or an adhesion-reinforcing intermediate layer can only be provided in the edge area and can be dispensed with entirely in the inner area. In a preferred embodiment, the layer sequence of the flexible circuit configuration is deposited directly on the substrate surface without an intermediate layer in the inner area and an adhesion-reinforcing intermediate layer is provided in the edge area.

The structure and composition of the intermediate layer depend on the respective materials of the substrate and the first layer of the layer sequence for the flexible circuit configuration. In the case of the preferred creation of an insulating layer made of a polymer, preferably polyimide, as the first layer of the layer sequence over a substrate, which advantageously comprises glass or ceramic or in particular silicon (Si), preferably having a thermally oxidized surface, the intermediate layer is advantageously constructed from at least two partial intermediate layers, which are preferably only deposited in the edge area on the substrate. In particular, in an advantageous embodiment it can be provided that a first partial intermediate layer which is provided on the substrate surface comprises titanium (Ti) or a titanium alloy, such as TiW, and a second partial intermediate layer, on which the first layer of the layer sequence is deposited, comprises gold (Au).

The adhesion of two layers on one another can be quantitatively determined in particular as the force which is required to peel off the layers from one another.

The adhesive force of the intermediate layer directly on the substrate, e.g., TiW on Si, and optionally between multiple partial intermediate layers, such as Au on TiW, is assumed to be stronger than the adhesive force of the layer sequence on the intermediate layer, e.g., polyimide on Au, so that the adhesion of the layer sequence in the edge area relative to the substrate is determined by the adhesive force between layer sequence and intermediate layer.

The adhesion of polyimide on gold of the intermediate layer over the edge area is substantially stronger than the adhesion of polyimide directly on the substrate surface.

The flexible circuit configuration is removed from the substrate separately from the layer sequence in the edge area after deposition of all layers and after possible further method steps, which are performed in the case of a flexible circuit configuration held on the substrate. The layer sequence in the edge area can remain on the substrate. To separate the circuit configuration from the layer sequence in the edge area, the flexible circuit configuration is advantageously cut out of the flexible circuit configuration and removed from the substrate. To cut the flexible circuit configuration out of the layer sequence, grooves are advantageously created through the layer sequence up to the substrate, possibly also into it or through it. The grooves describe the outline of the flexible circuit configuration. The grooves may advantageously be created by laser beam cutting or using a mechanical cutting tool.

The layer sequence contains at least one insulating layer made of electrically insulating insulation material, in particular a polymer, and at least one conductive layer made of an electrically conductive material, in particular a metal, preferably copper or gold. At least the at least one conductive layer is structured to implement a structure made of conductor paths and conductor surfaces. At least two conductive layers are preferably provided, which are separated by at least one insulating layer, electrical connections preferably being produced between two spaced-apart conductive layers through openings in the interposed insulating layer.

An insulating layer made of a polymer is advantageously created in a way known per se in that insulating material is deposited in free-flowing form on the substrate, the intermediate layer, or an already created part of the layer sequence and is solidified at elevated temperature. The insulating layers are advantageously created having layer thicknesses of at least 1 µm, in particular at least 2 µm, and at most 20 µm, in particular at most 10 µm. Structuring of an insulating layer created in this manner is advantageously performed by photolithography using an exposure mask in a way typical per se, the insulation material itself being able to be exposed or being able to be covered by a photoresist mask which can be exposed. Material is selectively removed again from the insulating layer, which is deposited over the entire area, in area regions determined by the mask exposure. A material is advantageously selected for the insulating layers whose coefficient of thermal expansion (CTE) differs by not more than $10 \times 10^{-6}$/K, in particular not more than $5 \times 10^{-6}$/K, from the coefficient of thermal expansion of the substrate material. A material having a coefficient of thermal expansion similar to typical substrate material is available, for example, as PI-2611 from HD Micro Systems, Parlin, N.J., USA.

The at least one conductive layer of the layer is preferably metal, gold or copper preferably being able to be used as the metals. Adhesion promoter layers, in particular made of Ti or TiW, may be deposited at interfaces between conductive layers and insulating layers.

The creation of a structured conductive layer is advantageously also performed by photolithography, instead of the deposition over the entire area with following selective removal, selective deposition in the lift-off method or selective galvanic reinforcement also being able to be provided. During the depositing of a conductive layer over an opening in an insulating layer, a through contact can be created to another conductive layer.

Using such through contacts between two spaced-apart conductive layers, a coil structure similar to that in US 2007/0241201, which was cited at the beginning, can advantageously be created, which preferably encloses a coil core made of a hard-magnetic or soft-magnetic material. The coil core is advantageously deposited on an insulating layer as a support layer in the form of a layer made of the magnetic material, for which purpose the support layer is advantageously previously smoothed out, e.g., by mechanical grinding. The insulating layer used as a support layer can be created for this purpose in an advantageous embodiment as a material having improved chemical and/or mechanical resistance in relation to the material of one or more insulating layers deposited later. In particular, using identical free-flowing starting material of various insulating layers, improved resistance can be created by solidifying the insulating material at elevated higher temperature, for example, approximately 350° C. For insulating layers of the layer sequence which are deposited later, a reduced higher temperature of less than 300° C., for example, can advantageously be applied during the solidification of the insulating material, which is advantageous in particular if elements are integrated in the layer sequence, after the mentioned support layer and before the last method step, which may not be heated above the lower elevated higher temperature. The creation of an insulating layer having improved resistance with respect to one or more insulating layers deposited later and the smoothing of the surface of the more resistant insulating layer, e.g., by mechanical grinding, is also independently significant for the invention, independently of the difference of the adhesion of the layer sequence over the edge area, on the one hand, and the inner area, on the other hand, and also independently of the special application, and is particularly advantageous if a smooth support surface is required inside the layer sequence over at least one structured layer and/or temperature-sensitive material is deposited in the layer sequence in following steps.

Advantageously, terminal surfaces, for the electrical connection of the flexible circuit configuration to circuit elements, a further circuit configuration, or in particular a larger circuit board, are created at least in the uppermost conductive layer, i.e., the conductive layer furthest apart from the substrate. A carrier film can advantageously be applied to the upper side facing away from the substrate, the carrier film advantageously being applied to the upper side of the layer sequence, as long as the layer sequence is still held on the rigid substrate. Through contacts lead through the carrier film, which remains connected to the layer sequence in the flexible circuit configuration, the through contacts being electrically connected to the mentioned terminal surfaces on the side of the carrier film facing toward the layer sequence and leading to contact surfaces on the side of the carrier film facing away from the layer sequence. The contact surfaces are electrically contacted with counter surfaces of a larger circuit board, e.g., by soldering or gluing, when the flexible circuit configuration is connected to such a circuit board.

In a typical procedure, the carrier film can be prepared with through contacts and contact surfaces corresponding to the surface pattern of the terminal surfaces on the layer sequence and can be applied in the correct position to the layer sequence, electrical connections of the through contacts to the terminal surfaces being created by soldering or gluing. Typically, for this purpose, after covering the last conductive layer of the layer sequence using a last insulating layer, openings are exposed in this last insulating layer to the terminal surfaces of the last conductive surface and additional metal terminal structures, such as expanded terminal surfaces in particular, are created on the upper side of the last insulating layer. Notwithstanding this, it is provided according to a further aspect of the invention that the carrier film is applied to the upper side of the layer sequence in the unstructured state, i.e., without perforations and through contacts, and is connected flatly thereto, in particular laminated thereon, and the perforations through the carrier film are only produced thereafter at the positions of the terminal surfaces of the layer sequence. The carrier film can comprise multiple layers and/or partial films.

The production of the perforations through the carrier film can be performed like the preceding structuring of the layers of the layer sequence at high precision, in particular again by photolithography. The openings are preferably created by application of a focused laser beam to the carrier film in spots, which advantageously continues the openings in the carrier film through the thinner last insulating layer and stops at the metal terminal surfaces of the layer sequence.

A structured metal layer is deposited on the carrier film, which is provided with perforations, which metal layer forms the contact surfaces on the side of the carrier film facing away from the layer sequence, on the one hand, and extends up to the terminal surfaces of the layer sequence along the flanks of the perforations and is deposited directly thereon, on the other hand. Through the planar gluing of the carrier film to the upper side of the layer sequence, a large-area and particularly stable mechanical connection of the carrier film to the layer sequence is achieved. The deposition of the metal layer for the contact surfaces and the through contacts also on the terminal surfaces ensures particularly reliable electrical connections.

BRIEF DESCRIPTION OF THE DRAWINGS

The invention is explained in greater detail hereafter on the basis of preferred exemplary embodiments with reference to the drawings. In the figures.

DESCRIPTION OF THE PREFERRED EMBODIMENTS

Figure 1:
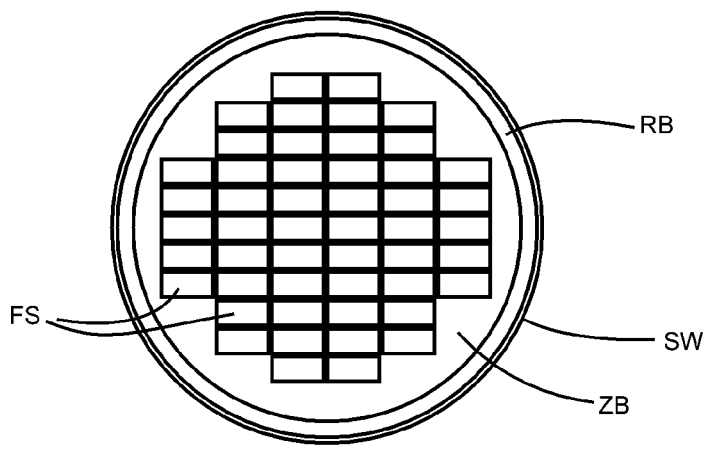
FIG. 1 shows a substrate having a plurality of flexible circuits.

FIG. 1 shows a configuration having a rigid substrate SW, for example, a silicon wafer, having a plurality of flexible circuit configurations FS. The flexible circuit configurations FS, which are assumed to be identical to one another in the outlined example, are formed by a layer sequence over the substrate SW and are situated in a regular raster in an inner area ZB of the layer sequence over the substrate SW. The shape and configuration of the multiple flexible circuits FS in FIG. 1 is to be understood as solely an example. The multiple circuit configurations may be designed differently from one another and/or may be distributed differently, in particular also irregularly, on the substrate surface. The inner area ZB is enclosed by a closed peripheral edge area RB. At least one of the layers of the layer sequence advantageously runs over the substrate SW via both the edge area RB and also via the central area ZB enclosed thereby. The position specification that the layer sequence runs over the substrate is to be understood to mean that the layer sequence follows, in the direction of the surface normals of the level surface of the substrate SW, directly on this substrate surface or via previously created layers.

The multiple flexible circuits FS advantageously form a regular raster in the inner area, which promotes the later separation of the individual flexible circuits.

Figure 2:
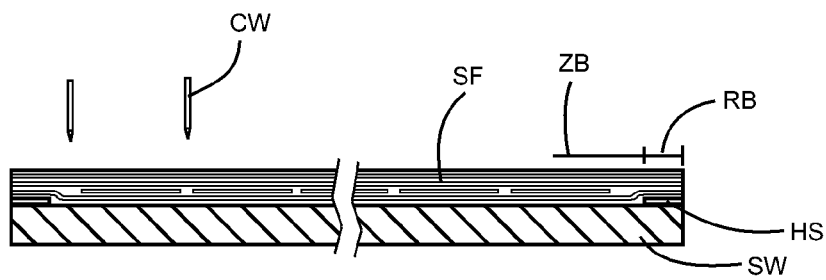
FIG. 2 shows a detail of a sectional side view of FIG. 1.

FIG. 2 schematically shows a sectional side view of the configuration according to FIG. 1, only diametrically opposing edge areas being shown. The layer sequence SF is indicated over the substrate SW. An adhesive layer HS is deposited as an intermediate layer in the edge area RB, while in contrast no immediate layer is provided in the inner area ZB. During deposition of the layer sequence SF, it is assumed that at least a first layer of this layer sequence, which is preferably an insulating layer, is deposited both over the inner area and also over the edge area. It is also assumed hereafter without restriction of the generality that such a first layer of the layer sequence is created continuously over the central area and the edge area without interruption. However, structures in the form of recesses may also be provided in this first area depending on the specific application.

Figure 3:
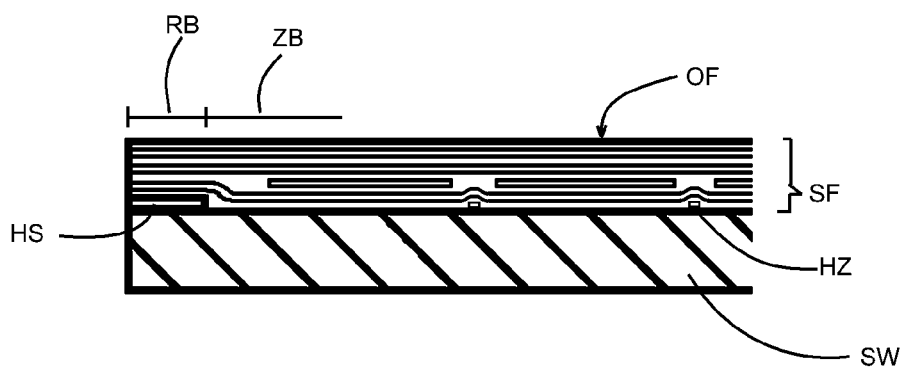
FIG. 3 shows an enlarged detail of an edge area from FIG. 2.

FIG. 3 shows an enlarged detail of a variant in which an intermediate layer is not only provided as an adhesive layer HS in the edge area, but rather also additional intermediate layer structures HZ are also provided in the inner area, for example, linear intermediate layer structures HZ in projection of the raster shown in FIG. 1 of the outlines of the multiple flexible circuits FS.

The adhesive layer HS in the edge area RB over the substrate SW is composed according to material and structure so that this adhesive layer, as an intermediate layer, promotes adhesion between the first layer of the layer sequence SF and the substrate SW which is stronger than the adhesion of the first layer without intermediate layer on the substrate SW.

Figure 4:
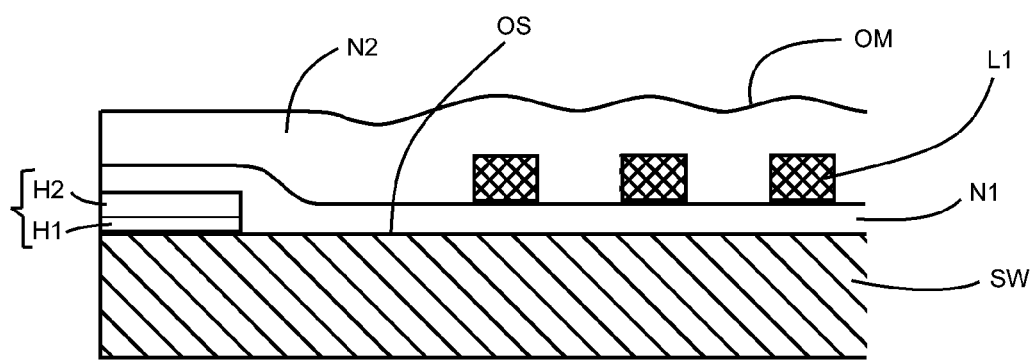
FIG. 4 shows an initial layer sequence in a preferred application.

An example of an initial structure of a layer sequence over the substrate SW is schematically shown in FIG. 4, greatly enlarged from FIG. 3. Before deposition of the layer sequence in the edge area RB over the substrate SW, the adhesive layer HS is deposited as an intermediate layer, this intermediate layer being constructed from a first partial intermediate layer H1 and a second partial intermediate layer H2. The structured deposition of the double layer of the intermediate layer as an adhesive layer delimited to the edge area can be performed according to generally typical methods for creating structured layers, in particular by deposition over the entire area with selective removal in accordance with a photoresist mask or by deposition over the entire area on a structured photoresist mask and removal of excess layer material in the lift-off method. Methods for creating structured layers or layer sequences are well known, so that they are not described in detail hereafter and rather are presumed to be known.

In an advantageous embodiment, the adhesive layer HS contains titanium as a layer material or as a component of the layer material, the latter in particular as a TiW alloy, in the first partial intermediate layer H1. Titanium or alloys having titanium as a substantial component are particularly advantageously suitable as adhesion promoters for substrate materials such as silicon, in particular having thermally oxidized surface, glass, or ceramic. A silicon wafer is assumed hereafter as the rigid substrate SW without restriction of the generality.

The second partial intermediate layer H2 comprises a material which displays good adhesion both with respect to the first partial intermediate layer and also with respect to the first layer N1 of the layer sequence SF. In the case of the preferred use of polyimide for the first layer N1, the second partial intermediate layer H2 preferably comprises gold (Au). The adhesion of polyimide on thermally oxidized silicon is low in relation to the adhesion of polyimide on gold, but is still sufficiently high that a displacement of the first layer N1 on the substrate SW or lifting of the first layer off of the substrate with bubbling is reliably prevented in the individual method steps for producing the flexible circuit configuration on the substrate SW.

The first insulating layer is preferably formed by a polyimide as the insulation material. A material is advantageously selected, whose coefficient of thermal expansion differs by no more than $10 \times 10^{-6}$/K, preferably no more than $5 \times 10^{-6}$/K from the coefficient of thermal expansion of the substrate SW. A material suitable for typical substrate materials for this purpose has already been named by trade name and reference source. The insulation material is preferably applied in free-flowing form in a way which is typical per se and is uniformly distributed at the desired layer thickness on the surface to be coated by a spinning method, for example. Through a subsequent heat treatment using application of temperatures of typically at least 250° C., the insulation material is solidified to form the polyimide. Edges in a surface on which such an insulating layer is deposited are smoothed, as shown in FIG. 4 on the edge of the adhesive layer HS.

In the example according to FIG. 4, a structured conductive layer having conductor structures L1 is created in the inner area ZB on the upper side of the first insulating layer N1 facing away from the substrate. The creation of the structured conductive layer can be performed in various ways known per se, as already mentioned. A second insulating layer N2 is deposited on the structured first conductive layer, which can particularly comprise the same material as the first insulating layer N1. The material of the second insulating layer N2 fills up the intermediate spaces between the conductor structures L1 of the first conductive layer. Depending on the thickness of the second insulating layer N2, the conductor structures L1 of the first conductive layer are transferred having different degrees of waviness to the surface of the second layer N2 facing away from the substrate SW.

Depending on the application, further structured conductive layers and/or insulating layers may follow the second insulating layer N2. Perforations may be created through the insulating layers for connecting conductive layers, which follow one another perpendicular to the substrate plane and are separated by insulating layers, in which openings the layer material of the conductive layer forms through contacts through the insulating layer to the conductive layer lying underneath during deposition of a conductive layer on such a structured insulating layer.

Flexible circuit configurations in such multilayer technology having multiple conductive layers, which are insulated from one another and are connected via through contacts, are fundamentally known.

Figure 5:
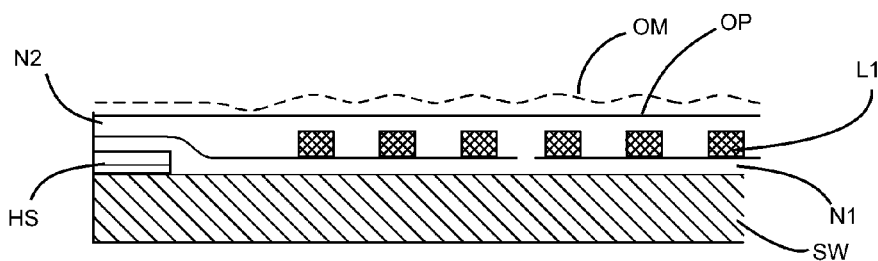
FIG. 5 shows the smoothing out of an insulating layer.

FIG. 5 shows an advantageous method step during the production of a flexible circuit configuration by depositing a layer sequence on a rigid substrate SW. For the sake of simplicity, the exemplary application according to FIG. 4 is used as the basis, in which an insulating layer is deposited over conductor structures L1 of a structured conductive layer and the surface of this insulating layer N2, which faces away from the substrate SW, displays an irregularity caused by structures lying underneath.

The insulating layer N2 is advantageously produced having such a resistance of the solidified insulating material that the wavy surface OM of the insulating layer N2, which is shown by interrupted lines, for example, it can be smoothed using a mechanical grinding procedure to form the level support surface OP, which is shown by an interrupted line. The resistance of an insulating layer, which is created by thermal solidification, made of a polymer, in particular a polyimide, can typically be influenced by the method parameters of the solidification step, in particular the applied higher temperature and its action time. The temperature treatment which is required for a desired resistance of the material varies depending on the desired resistance and the starting material. In the case of the above-mentioned material which is preferably used for polyimide as the material of an insulating layer, in the case of a temperature treatment at approximately 350°

C. for solidifying the insulating material, a mechanical resistance which allows a mechanical grinding procedure is achieved, for example.

After smoothing of the surface of the second insulating layer N2 on the level support surface OP, the second insulating layer N2 can advantageously be used as a support layer for a component of the flexible circuit configuration, in which a level substrate is of special significance. In the example outlined in FIG. 6, a structured layer made of magnetic material MK is deposited on the smoothed surface OP of the second insulating layer N2. The structured layer having the magnetic material is known per se from the prior art mentioned at the beginning. The magnetic material can particularly form a strip-shaped structure on the surface OP of the second insulating layer N2.

A further insulating layer N3 is deposited over the layer having the magnetic material. During the deposition of this third insulating layer N3, if the above-mentioned special polyimide is used as the insulating material, the elevated temperature at which the polyimide is solidified from the free-flowing phase can be selected as lower than in the case of the second insulating layer N2. Through the possibility of selecting the elevated temperature as lower during the solidification of the insulating material than in the case of the second insulating layer N2, a possibly provided temperature sensitivity of a layer material deposited over the second insulating layer N2, such as the magnetic material MK, can advantageously be taken into consideration. The elevated temperature applied for the solidification of the third insulating layer N3 is advantageously less than 300° C. In consideration of temperature-sensitive material, the lower elevated temperature of 300° C. in the exemplary case is also no longer exceeded in the case of further layers which are still deposited hereafter, so that, for example, a terminally deposited insulating layer NF is also only solidified at a temperature of less than 300° C. and the insulating layers N3 and NF thus have a lower hardness than the second insulating layer N2. The first insulating layer N1 is advantageously also solidified at the higher elevated temperature of 350° C. in the exemplary case, like the insulating layer N2.

Figure 6:
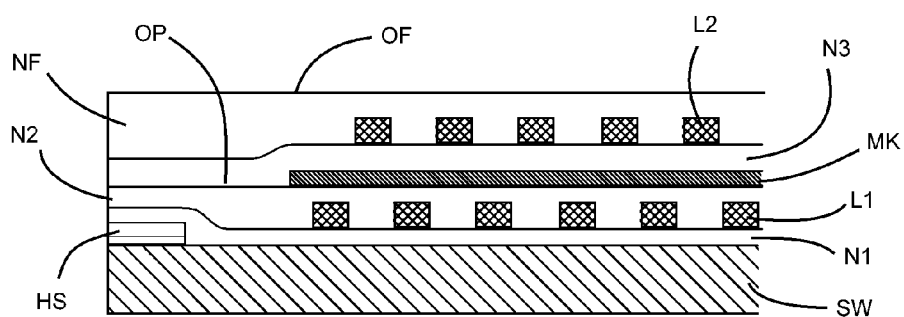
FIG. 6 shows a section through a structure of a preferred application.

In the example outlined in FIG. 6, a second structured conductive layer having conductor structures L2 is created over the second insulating layer N3. The conductor structures of the first and second conductive layers L1 and L2 may be electrically connected to one another via connections (not shown in FIG. 6) through the insulating layers N2 and/or N3, which lie between these conductive layers.

In the special application, which is known per se from the prior art mentioned at the beginning, of the integration of a coil configuration in the flexible circuit configuration, the conductor structures of the first and second conductive layers L1 and L2, in particular a coil having a plurality of turns and having a coil axis running essentially parallel to the substrate surface, may be implemented.

Figure 7:
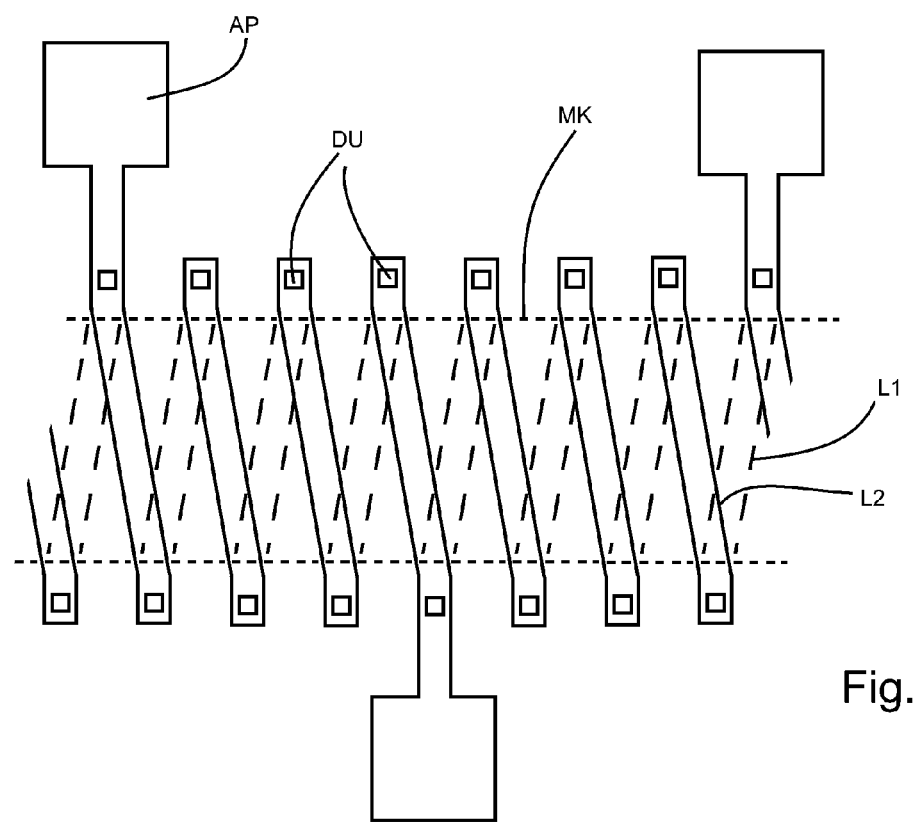
FIG. 7 shows a top view of a magnetic configuration which is integrated in a flexible circuit.

FIG. 7 shows a schematic illustration of conductor structures with implementation of such a coil configuration having viewing direction parallel to the surface normals of the substrate surface. Structures are shown by solid lines in the second conductive layer L2, which each form the sections of the coil turns facing away from the substrate. The conductor structures are shown by coarsely interrupted lines in the conductive layer L1, which are electrically connected via through contacts DU created through the insulating layers N2, N3, between the structures L1 and L2 of the first and second conductive layers to the conductor structures of the second conductive layer L2. Through opposing inclination of the courses of conductor structures L1 and L2, respectively, in the conductive layers, coil turns of a linear coil configuration arise. The coil turns enclose the strip-shaped structure MK, which is shown by finely interrupted lines, of the magnetic material forming the coil core.

Individual sections of the elongate coil configuration may be used as partial coils and may be activated separately via electronics via terminal surfaces AP, which are preferably performed as parts of the conductor structures in the second conductor plane and are connected to selected terms structures of the second conductor plane. Possibilities for activating the coil configuration and the use thereof are described in detail in the prior art mentioned at the beginning, so that reference is made to this known description for this special application.

Typical layer thicknesses of the insulating layers are 2-10 μm. The thickness of the conductive layers is typically 2-10 μm.

The layer sequence SF per se is typically not detached alone from the substrate and used further, but rather a carrier film is normally applied to the layer sequence still located on the substrate and separated together with the individual flexible circuit configurations FS in their raster and the flexible circuits FS are removed as a composite of the carrier film and the layer sequence from the substrate and used further. The carrier film can particularly be advantageous for the handling of the flexible circuit and its configuration and electrical contacting on a circuit board.

The carrier film is typically prepared for this purpose in such a way that perforations are created through the film surface in a raster corresponding to the raster of the terminal surfaces AP in the layer sequence and are metal plated as through contacts as the electrical connection between inner and outer contact surfaces, which are implemented on the opposing sides of the carrier film. In the case of the layer sequence, in a known procedure, perforations to terminal surfaces of conductive layers lying underneath are created in the last insulating layer and, via a further structured metal plating, to further terminal surfaces lying over the last insulating layer and from these through contacts to terminal surfaces inside the layer sequence. The inner contact surfaces of the carrier film are electrically connected to the further terminal surfaces on the layer sequence, for example, by soldering or by use of a conductive adhesive.

Figure 8:
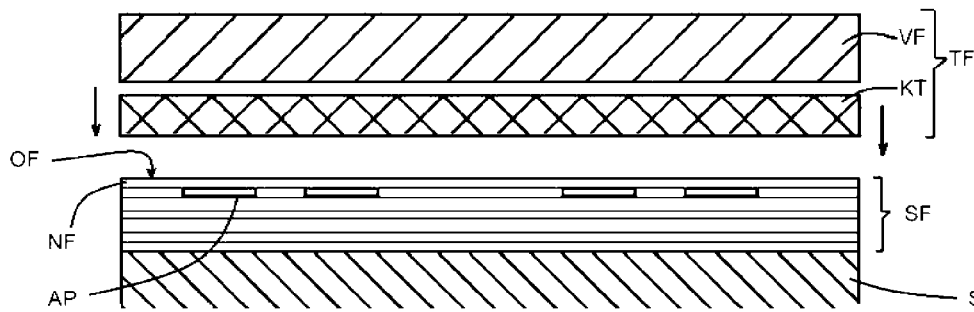
FIG. 8 shows the application of a carrier film to a layer sequence.

In the present invention, the last insulating layer NF, which forms the surface OW of the layer sequence facing away from the substrate SW, is advantageously no longer structured and the carrier film is also applied without prior structuring, as shown in FIG. 8, to the surface OF and is flatly connected thereto, in particular by lamination. In an advantageous embodiment, the carrier film can be implemented as multilayered, in particular having an adhesive film KT and a reinforcement film VF. The adhesive film ensures a reliable flat connection to the upper side of the layer sequence. Adhesive film and reinforcement film are preferably situated as individual films on the upper side of the layer film and are jointly connected to one another and to the layer sequence. The carrier film can also be formed by one or more adhesive films, which can preferably be softened by application of higher temperatures to produce the adhesive bond.

After connecting the carrier film TF to the surface OF of the layer sequence SF, perforations DT are created through the carrier film, which are also continued through the last insulating film NF up to the terminal surfaces AP within the layer sequence SF. The perforations DT are preferably created using a position-controllable, focused laser beam. The material ablation by laser beam action is particularly advantageous in this method stage and the stop of the material ablation upon reaching the typically metal terminal surfaces AP can be maintained particularly reliably.

Figure 9:
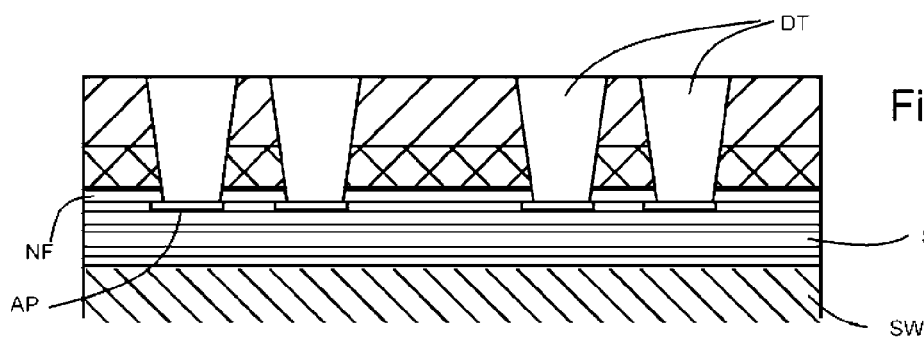
FIG. 9 shows the creation of perforations through the carrier film.

After creating the perforations DT through the carrier film TF and the last insulating layer NF up to the terminal surfaces AP, according to FIG. 9, structured conductor material, in particular metal, is again deposited in structured form on the side of the carrier film TF facing away from the substrate SW. The structured deposited material forms, on the one hand, contact surfaces KP on the surface of the of the carrier film TF facing away from the substrate SW and, continued therefrom, through contacts KD through the perforations DT up to the terminal surfaces AP.

Through the planar connection of the carrier film TF to the surface OF of the layer sequence according to FIG. 8, a particularly solid mechanical connection is achieved between carrier film TF and layer sequence SF. The creation of perforations DT only after application of the carrier film TF results in particularly high precision during the orientation of the perforations DT relative to the terminal surfaces AP within the layer sequence, since the position references of the substrate are still also usable for the creation of the perforations DT. Through the direction action of the terminal surfaces AP within the layer sequence to the external contact surfaces KP on the carrier film TF via the through contacts KD, which are created jointly with the contact surfaces KP, extend up to the terminal surfaces AP, and are deposited directly thereon, a particularly reliable electrical connection of the layer sequence to the contact surfaces KP results.

The thickness of the carrier film is typically between 50 µm and 200 µm. The partial films are advantageously at least 10 µm thick. The surface diameters of the terminal surfaces AP in the layer sequence are between 100 µm and 200 µm, for example, and the surface diameters of the contact surfaces KP are between 100 µm and 200 µm. However, the invention is not restricted to such dimensions.

Figure 10:
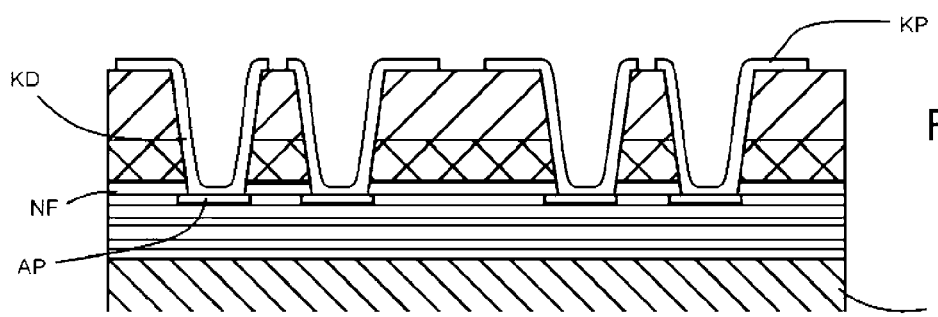
FIG. 10 shows the creation of through contacts and contact surfaces.
Figure 11:
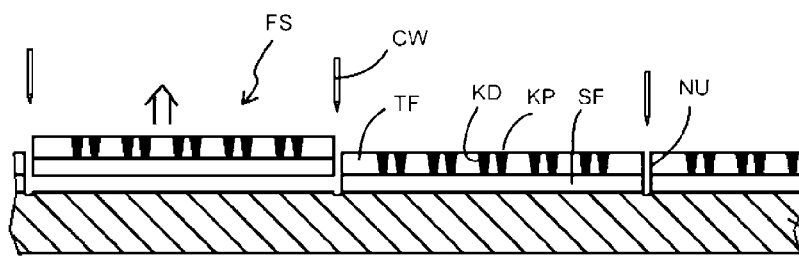
FIG. 11 shows the removal of a flexible circuit configuration from a substrate.

FIG. 11 shows the separation and removal of the flexible circuit configurations FS from the substrate, after the creation of the contact surfaces KP on the carrier film TF according to FIG. 10 is completed. Via cutting tools CW, grooves are created through the carrier film TF and the layer sequence SF up to the substrate SW from the upper side of the carrier film TF along the raster lines of the configuration of the multiple flexible circuit configurations FS according to FIG. 1, and the flexible circuit configurations are thus laterally separated from one another. Cutting tools for the separation of multiple flexible circuit configurations are known in various forms per se from the prior art. In particular mechanical tools or laser beams are suitable for creating the grooves NU.

In another embodiment, the substrate SW can also be cut through completely at the positions of the grooves NU and the flexible circuit configurations FS may then remain connected to parts of the substrate for further handling and only be detached from the substrate later as isolated flexible circuit configurations.

After separation of the individual flexible circuit configurations FS, which are situated on the substrate SW, they may be removed individually from the substrate SW, for which purpose only a small force is advantageously necessary due to an intentionally low selected adhesion of the layer sequence on the substrate, through which damage of the flexible circuit configuration FS is prevented. One of the flexible circuit configurations has already been lifted off of the substrate SW in the direction of the double arrow in FIG. 11.

Figure 12:
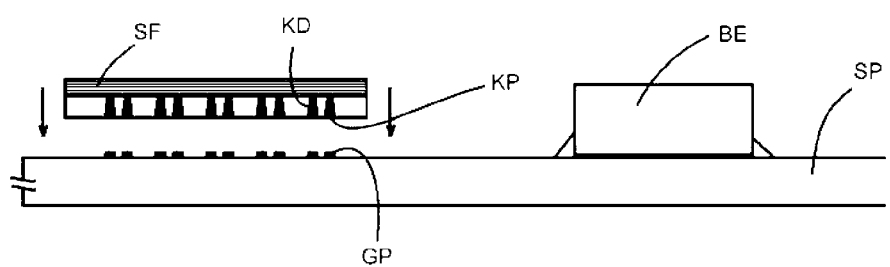
FIG. 12 shows the connection of a flexible circuit configuration to a circuit board, The figures are only to be understood as schematic explanations and in particular are not to scale in relation to one another.

FIG. 12 shows the advantageous further use of a flexible circuit configuration FS in connection with a circuit board SP, which can in turn be flexible per se. The flexible circuit configuration FS faces toward the carrier film TF of the circuit board SP for the connection to the circuit board SP using the contact surfaces KF. Counter contact surfaces GP are provided on the circuit board SP in a pattern corresponding to the contact surfaces KP of the flexible circuit configuration. The electrical connection between the contact surfaces KP and the counter contact surfaces GP may be produced by soldering or by electrically conductive adhesive bonds. Further components BE, such as electronic controllers, passive components, or a battery in particular may typically be provided on the circuit board.

In the layer structure of the layer sequence, mediating layers for creating good flat connections between successive layers may be provided at layer boundaries. In particular, adhesion promoting material, such as Ti or TiW, may be provided at interfaces between metal conductive layers and polymer insulating layers.

The above features and the features which are specified in the claims and can be inferred from the figures can be implemented advantageously both individually and also in various combinations. The invention is not restricted to the described exemplary embodiments, but rather can be altered in many ways in the scope of knowledge in the art.

The invention claimed is:

1. A method for producing a flexible planar circuit configuration (FS) having multiple layers forming a layer sequence (SF), in which
   an intermediate/adhesive layer (HS) is created on a substrate surface (OS) of a rigid substrate (SW),
   at least one first insulating layer (N1) is created over the substrate (SW) with the intermediate/adhesive layer (HS),
   at least one first conductive layer is created over the first insulating layer (N1),
   a conductive structure (L1) is created in at least the at least one conductive layer,
   a flexible planar circuit configuration (FS) comprising the at least one first insulating layer (N1), the at least one first conductive layer and the conductive structure (L1) is removed from the substrate (SW) after deposition of all layers,
   wherein:
   the intermediate/adhesive layer (HS) is created in such a way that at least one inner area (ZB) and an edge area (RB surrounding the inner area (ZB) are defined on the substrate surface (OS) of the substrate (SW), the intermediate/adhesive layer (HS) being only provided outside the inner area (ZB),
   the first insulating layer (N1) of a layer sequence (SF) comprised by the intermediate/adhesive layer (HS), the at least one first insulating layer (N1) and at least one first conductive layer, is created over the inner area (ZB) and the edge area (RB) such that the first insulating layer (N1) has a stronger adhesion with respect to the substrate (SW) over the edge area (RB) than over the inner area (ZB), and
   the flexible planar circuit configuration (FS) is created directly over the inner area (ZB) of the substrate (SW) with no adhesive layer in between, whereby the flexible planar circuit configuration (FS) can be easily detached from the substrate (SW), because the inner area (ZB) over which the flexible planar circuit configuration (FS) is formed is not adhered to the substrate (SW) by the intermediate/adhesive layer (HS).

2. The method according to claim 1, wherein the flexible planar circuit configuration (FS) is removed from the substrate (SW) separately from the edge area (RB).

3. The method according to claim 2, wherein the flexible planar circuit configuration (FS) is cut out of the layer sequence (SF) and removed from the substrate (SW), while the layer sequence (SF) remains on the substrate (SW) in the edge area (RB).

4. The method according to claim 3, wherein grooves (NU) are created through the layer sequence (SF) up to the substrate (SW), in order to cut out the flexible planar circuit configuration (FS).

5. The method according to claim 1, wherein the intermediate/adhesive layer (HS) is only provided in the edge area (RB), when the first insulating layer (N1) is deposited.

6. The method according to claim 1, wherein the intermediate/adhesive layer (HS) is created in the form of at least two partial intermediate/adhesive layers (H1, H2).

7. The method according to claim 1, wherein the intermediate/adhesive layer (HS) is created at least at the interface to the substrate (SW) using a layer material containing titanium.

8. The method according to claim 1, wherein the intermediate/adhesive layer (HS) is deposited having gold as a layer material at least on its side facing toward the first insulating layer (N1).

9. The method according to claim 1, wherein silicon is selected as the substrate material.

10. The method according to claim 1, wherein different surface structures are created in various layers of the layer sequence (SF).

11. The method according to claim 1, wherein the surface structures are created by photolithography.

12. The method according to claim 1, wherein the at least one insulating layer (N1) is created by applying an insulation material in free-flowing form and by solidification at an elevated higher temperature of approximately 662° F. (350° C.).

13. The method according to claim 12, wherein temperatures of at least 250° C. are applied for the solidification.

14. The method according to claim 1, wherein the insulating layer (N1) is created as a polyimide layer.

15. The method according to claim 1, wherein the layer sequence (SF) is created having at least two conductive layers, between which at least one insulating layer is incorporated.

16. The method according to claim 15, wherein conductive connections (DU) are created between two conductive layers, which are separated by at least one insulating layer as a separation layer (N2, N3).

17. The method according to claim 16, wherein the conductive connections (DU) are created as through contacts (DW) through the separation layer.

18. The method according to claim 16, wherein magnetic material (MK) is deposited between two conductive layers (N2, N3), and a coil is created around a magnetic material (MK) via conductive connections (DU) between the two conductive layers.

19. The method according to claim 18, wherein the magnetic material (MK) is deposited on an insulating layer (N2) as a structured layer.

20. The method according to claim 19, wherein the structured layer is smoothed out by mechanical grinding before the magnetic material (MK) is deposited.

21. The method according to claim 20, wherein the structured layer is created from the same free-flowing starting material as an insulating material, which is created over the magnetic material (MK), but using higher temperatures during the solidification.

22. The method according to claim 1, wherein terminal surfaces (AP) are created in the uppermost conductive layer of the layer sequence (SF).

23. The method according to claim 22, wherein a carrier film (TF) is connected to the surface (OF) of the layer sequence (SF) which faces away from the substrate (SW).

24. The method according to claim 23, wherein the carrier film (TF) is connected to the layer sequence (SF) while the layer sequence (SF) is situated on the substrate (SW).

25. The method according to claim 24, wherein electrical connections (KD) are produced from the terminal surfaces (AP) of the layer sequence (SF) to contact surfaces (KP) on the side of the carrier film facing away from the layer sequence (SF) through openings (DT) in the carrier film (TF) up to the terminal surfaces (AP).

26. The method according to claim 25, wherein the openings (KT) are created in the carrier film (TF) up to the terminal surfaces (AP) of the layer sequence (SF) after the carrier film (TF) has been connected to the layer sequence (SF), and structured contact metal is deposited on the carrier film, which forms the contact surfaces (KP) and through contacts (KD) to the terminal surfaces (AP).

27. The method according to claim 26, wherein the flexible planar circuit configuration (FS), which is removed from the substrate (SW), is electrically connected using the contact surfaces (KP) to counter surfaces (GP) of an electrical circuit board (SP).

28. The method according to claim 1, wherein the intermediate/adhesive layer (HS) is created at least at the interface to the substrate (SW) using a layer material containing TiW.

29. The method according to claim 1, wherein silicon having a thermally oxidized surface, glass, or ceramic is selected as the substrate material.

* * * * *